United States Patent
Kohl et al.

(10) Patent No.: US 12,207,441 B2
(45) Date of Patent: Jan. 21, 2025

(54) COMPONENTS FOR A FLUID COOLING SYSTEM AND FLUID COOLING SYSTEM HAVING THESE COMPONENTS

(71) Applicant: Techn GmbH, Berlin (DE)

(72) Inventors: Nikolaus Kohl, Berlin (DE); Thilo Guschauski, Berlin (DE)

(73) Assignee: Techn GmbH, Berlin (DE)

( * ) Notice: Subject to any disclaimer, the term of this patent is extended or adjusted under 35 U.S.C. 154(b) by 409 days.

(21) Appl. No.: 17/603,730

(22) PCT Filed: Mar. 30, 2020

(86) PCT No.: PCT/EP2020/058981
§ 371 (c)(1),
(2) Date: Oct. 14, 2021

(87) PCT Pub. No.: WO2020/212125
PCT Pub. Date: Oct. 22, 2020

(65) Prior Publication Data
US 2022/0201898 A1    Jun. 23, 2022

(30) Foreign Application Priority Data
Apr. 17, 2019 (EP) .................................. 19169973

(51) Int. Cl.
*F28F 19/00* (2006.01)
*G06F 1/20* (2006.01)
*H05K 7/20* (2006.01)

(52) U.S. Cl.
CPC .......... *H05K 7/20281* (2013.01); *G06F 1/20* (2013.01); *H05K 7/20136* (2013.01); *H05K 7/20263* (2013.01); *H05K 7/20272* (2013.01)

(58) Field of Classification Search
CPC .......... H05K 7/20281; H05K 7/20136; H05K 7/20263; H05K 7/20272; G06F 1/20
(Continued)

(56) References Cited

U.S. PATENT DOCUMENTS 2,510,125 A    6/1950  Meakin
5,129,621 A    7/1992  Maiville et al.
(Continued)

FOREIGN PATENT DOCUMENTS

CN    107637188 A    1/2018
DE    2431680 A1    1/1975
(Continued)

OTHER PUBLICATIONS

European Patent Office, International Search Report and Written Opinion in Application No. PCT/EP2020/058981, dated Jul. 16, 2020, 12 pages, Rijswijk, Netherlands.
(Continued)

*Primary Examiner* — Davis D Hwu
(74) *Attorney, Agent, or Firm* — Marshall & Melhorn, LLC

(57) ABSTRACT

A first module for a fluid cooling system may have a control unit, a first communication unit, a pump for a cooling fluid, and a first heat exchanger. The first communication unit may be configured to receive signals from at least one second module, the signals having an identification feature of the second module. The control unit, on the basis of the identification feature, is designed for identifying the second module, checking whether the second module is system-compatible or authorized, and switching on the pump and/or the first heat exchanger depending on the presence of the system-compatible or authorized second module. A cooling fluid system may have the first module and a second module.

16 Claims, 7 Drawing Sheets

(58) Field of Classification Search
USPC .......................................................... 165/11.1
See application file for complete search history.

(56) References Cited

U.S. PATENT DOCUMENTS

| | | |
|---|---|---|
| 10,164,373 B1 | 12/2018 | Cheon et al. |
| 2002/0000257 A1 | 1/2002 | Mead et al. |
| 2014/0183957 A1 | 7/2014 | Duchesneau |
| 2016/0010772 A1 | 1/2016 | Tiberghien et al. |
| 2017/0127575 A1 | 5/2017 | Lunsman et al. |
| 2017/0294103 A1 | 10/2017 | Vanberg et al. |

FOREIGN PATENT DOCUMENTS

| | | |
|---|---|---|
| DE | 9401605 U1 | 3/1994 |
| DE | 102016112279 A1 | 1/2018 |
| FR | 3057344 A1 * | 4/2018 |

OTHER PUBLICATIONS

China National Intellectual Property Administration, Search Report in Application No. CN202080037656.4, dated Aug. 29, 2023, 2 pages.

\* cited by examiner

COMPONENTS FOR A FLUID COOLING SYSTEM AND FLUID COOLING SYSTEM HAVING THESE COMPONENTS

FIELD

The invention relates to various components, particularly for use in a fluid cooling system and a fluid cooling system having these components. The components described particularly enable a modular structure of a fluid cooling system.

BACKGROUND

Fluid cooling systems usually comprise two heat exchangers which are fluidically connected to one another via fluid lines and a pump. For example, the heat loss from electronic components can be transferred to a coolant at the first heat exchanger. The pump conveys the heated coolant through the lines to the second heat exchanger. The second heat exchanger is, for example, a radiator through which the heated coolant flows. Here, the heat from the coolant is released into the ambient air via a radiator. This heat transfer can be improved by the airflow from a fan.

The use of such a fluid cooling system in desktop PCs and other electronic systems can offer several advantages over conventional air cooling systems. In this way, the second heat exchanger, which transfers the heat to the ambient air, can be structurally positioned further away from the heat source. In air cooling systems, the heat transfer to the ambient air usually takes place directly at the heat source. Installation space and weight restrictions can be avoided through the spatial separation of fluid cooling systems. This means that radiators having a larger surface can be used and the cooling capacity can be increased. The water cooling systems currently on the mass market are almost exclusively encapsulated CPU cooling systems, which are usually not serviceable and expandable and therefore hardly useful for other components such as the graphics card.

The invention is based on the object of creating components or a system which at least partially overcomes the problems of the prior art.

SUMMARY

The present document discloses various aspects that solve the problem or that contribute to the solution of the problem.

According to a first aspect, a coupling device, particularly for a fluid cooling system, is proposed. The coupling device here comprises a first coupling unit having a first housing, which has a first sub-housing and a second sub-housing connectable to the first sub-housing. The first sub-housing has a first axial passage opening connectable to a first fluid line, a first signal interface and a first end face. Furthermore, the second sub-housing has a second axial passage opening connectable to a second fluid line, a second signal interface and a second end face.

The first end face and the second end face are shaped complementary to one another such that the first sub-housing and the second sub-housing are axially connectable to one another, and that in the axially coupled state of the two sub-housings, the passage openings are fluidically connected to one another and the signal interfaces are connected to one another.

In addition, the two sub-housings are laterally connectable to one another, so that in the laterally coupled state, the two sub-housings are arranged parallel to one another.

The separate sub-housings can be joined laterally or axially to one another to form a unit using the proposed coupling device. The coupling device thus has a modular structure, as a result of which the coupling device can be expanded as desired in series or in parallel by providing a plurality of first coupling units.

In one embodiment, the first sub-housing and the second sub-housing are connected to one another in a form-fitting manner both in the laterally coupled state and in the axially coupled state. In one embodiment, the first sub-housing comprises a first side surface and the second sub-housing comprises a second side surface. The first side surface and the second side surface can be shaped complementary to one another such that the two sub-housings are laterally connectable to one another. For example, one of the side surfaces of the sub-housings comprises at least one projection and the other side surface respectively comprises at least one recess shaped complementarily thereto. The projection engages in the recess in the laterally connected state of the first coupling unit. Furthermore, the sub-housings can have interlocking profiles. The interlocking profiles are preferably connected to one another in a form-fitting manner in the laterally coupled state.

In one embodiment, the coupling device can comprise an axial fixing element which is designed for fixing the first sub-housing and the second sub-housing in the axially coupled state of the two sub-housings. The axial fixing element can be a separate component which is connectable to the first sub-housing and the second sub-housing in the axially coupled state of the two sub-housings. A longitudinal direction of the axial fixing element can extend in the axial direction here. The axial direction can be defined here by the alignment of the passage openings or the fluid lines. In the axially coupled state of the two sub-housings, the axial fixing element is preferably connectable in a form-fitting manner to at least one of the sub-housings or to both sub-housings.

In a further embodiment, the axial fixing element has a side surface which is shaped complementary to the first side surface and to the second side surface. The side surface of the axial fixing element can also rest against said side surfaces in the axially coupled state of the two sub-housings. The axial fixing element can particularly have at least one projection and/or at least one recess and/or at least one profile, which are respectively shaped complementary to the recess and/or projection and/or the profiles of the two sub-housings.

In one embodiment, the coupling device comprises a fastening element for fastening the first coupling unit to the second coupling unit. The fastening element comprises, for example, a screw which can be screwed to a nut located in the first and/or second coupling unit. A longitudinal direction of the fastening element can be aligned along the axial direction. The fastening element can be inserted through an axially extending opening in the first and/or second coupling unit. The fastening element can limit the action of an assembly force during the coupling process, for example, against the spring-driven quick-release locking units in the region of the coupling system. This can prevent the assembly force from being introduced into sensitive components such as a graphics card or a mainboard (see below).

In a further variant, the coupling device comprises a first fluid line connected to the first passage opening and/or a second fluid line connected to the second passage opening. In order to reduce torsional stresses, said fluid lines are particularly rotatably connectable to the respective passage openings. The first fluid line and the second fluid line are fluidically connectable to a pump, as a result of which they can form a fluid return line and a fluid supply line for the pump. The fluid lines can each comprise a hose or a plurality of hoses made, for example, of a flexible material.

The coupling device can comprise at least one extension line, wherein the first sub-housing is fastened to a first end of the extension line and the second sub-housing is fastened to a second end of the expansion line. The modularity of the system can be further increased by the extension line. In a preferred embodiment, there are two or more extension lines. In this case, the coupling device comprises two or more first coupling units. The extension line can have a hose that is made of a flexible material, for example.

In a further development, the coupling device comprises a second coupling unit which is connectable to the first coupling unit. For example, in its laterally coupled state, the first coupling unit can be connectable or connected to the second coupling unit. The first coupling unit and the second coupling unit are usually connectable to one another in the axial direction.

The second coupling unit can have a third end face, which can be shaped complementary to the first end face and to the second end face. The third end face rests flat against the first end face and the second end face in the connected state of the first coupling unit and the second coupling unit. The first coupling unit and the second coupling unit are connectable to one another in a form-fitting manner. To avoid incorrect assembly, the first end face and/or the second end face and/or the third end face can be beveled, for example, in relation to the axial direction of the passage openings.

The second coupling unit can have
 a second housing having a third passage opening and a fourth passage opening, and
 a third signal interface and a fourth signal interface.

In one embodiment, the first coupling unit and the second coupling unit are designed:
 i. to establish a fluid connection between the first passage opening and the third passage opening and a fluid connection between the second passage opening and the fourth passage opening in the coupled state of the two coupling units.

Preferably, the first coupling unit and the second coupling unit are also formed
 ii. to establish a signal connection between the first signal interface and the third signal interface and a signal connection between the second signal interface and the fourth signal interface.

A signal connection is understood to mean a connection of the signal interfaces in which signals can be transmitted via the signal interfaces.

The coupling device can be designed such that when the coupling units transition from the decoupled state to the coupled state, the passage openings are first connected to one another and then the signal interfaces are connected to one another, or that when the coupling units transition from the decoupled state to the coupled state, the passage openings are connected to one another and the signal interfaces are connected to one another at the same time. For example, the connection of the signal interfaces can only be established when the fluid connection is almost completely or completely established. The fluid connection usually has the lowest flow resistance in the fully coupled state. In one embodiment, the connection of the signal interfaces is only established when a flow resistance of the fluid connection has fallen below a certain value. This can ensure that a pump and/or a first heat exchanger (see below) of a fluid cooling system is only activated when both the fluid connection and the connection of the signal interfaces have been established.

In a further embodiment, a spring-driven closure unit is provided on at least one of the passage openings or on each passage opening, which spring-driven closure unit seals the respective passage opening from the environment in every state of the coupling device.

The first sub-housing, the second sub-housing and/or the second housing can be manufactured from injection-molded materials, such as thermoplastic or thermosetting materials, in an injection molding process. Manufacturing these components using a 3D printing process would also be conceivable. In addition, the first sub-housing, the second sub-housing and/or the second housing can each be formed in one piece.

The coupling device is connectable to a heat sink, such as the heat sink of a second heat exchanger described below. The heat sink can have a fluid inlet and a fluid outlet, which is fluidically connectable to the respective passage openings of the second coupling unit. Usually, at least one fastening means is provided for fastening the second coupling unit to the heat exchanger.

In one embodiment, a first communication unit connected to the first signal interface and the second signal interface is provided. Furthermore, a second communication unit connected to the third signal interface and the fourth signal interface can be provided. In the coupled state of the coupling device, the first communication unit and the second communication unit are connectable to one another. The signal transmission of the communication units typically only takes place when the first coupling unit and the second coupling unit are completely coupled. This ensures that the cooling circuit on the coupling device is closed and the fluid cooling system can only then be put into operation. This prevents leaks that can arise, for example, from the pressure build-up in the pump and from half-closed coupling units. At least one of the two communication units or a control unit can be designed to recognize whether the coupling device is in a coupled or decoupled state, on the basis of the presence of the connection between the two communication units.

The first communication unit and the second communication unit are preferably connected to one another via signal lines. In a further variant, the first, second, third and/or fourth signal interfaces are each connected to signal lines. The fluid lines and the signal lines can be brought together. For example, the first fluid line and/or the second fluid line has a recess for guiding the first signal line or the second signal line. The recess can, for example, be helical or straight. The signal lines can surround the fluid lines. In one embodiment, the first communication unit and the second communication unit are designed to communicate with one another via electrical or optical signals. The signal lines can, for example, be or comprise optical cables, such as fiber optic cables, or electrical cables. Furthermore, the signals can comprise data, sensor signals, control signals and/or regulation signals. Depending on the embodiment, the signal interfaces are electrical or optical contact elements. If necessary, the optical signals can be converted into electrical signals and vice versa. Any analog signals can be converted into digital signals and vice versa. The signals can further be amplified or processed. For example, an opto-electrical converter, an electro-optical converter, an AD converter, a DA converter, a signal amplifier and/or a signal processing unit can be components of the first communication unit and/or the second communication unit.

According to a further aspect, a fluid cooling system is provided. The fluid cooling system comprises, for example, a first heat exchanger, a second heat exchanger, a pump, a control unit for controlling the pump, a fluid supply line, a fluid return line and signal lines. Furthermore, the fluid cooling system can have the coupling device described above.

It can be provided that, in the coupled state of the coupling device, the first heat exchanger and the second heat exchanger are fluidically connected to one another by means of the fluid supply line and the fluid return line for forming a fluid circuit. The control unit can be designed to switch on or activate the pump and/or the first heat exchanger only when the coupling device is in the coupled state. The control unit can further be designed to switch off the pump and/or the first heat exchanger if the coupling device is in the decoupled state. At least one of the two heat exchangers can have a fan which is connected to the control unit and can be controlled thereby. For example, the first heat exchanger comprises a fan connected to the control unit, wherein the fan is activated by the control unit.

The first communication unit and the control unit can, for example, be arranged on a common first electronic circuit board. Although described separately, the control unit and the first communication unit can be components of a single control and processing unit. The second communication unit can, for example, be arranged on a second electronic circuit board. For example, the second electronic circuit board is arranged on an outer side of said heat sink of the second heat exchanger.

The coupling device can particularly be designed to connect a first module and a second module of a modular fluid cooling system to one another (see below).

According to a further aspect, a first module, particularly for a fluid cooling system, is proposed. The first module comprises a control unit, a first communication unit, a pump for a cooling fluid, and a first heat exchanger.

The first communication unit is designed to receive signals from at least one second module, wherein the signals have an identification feature of the second module. The control unit, based on the identification feature, is designed for
  identifying the second module,
  checking whether the second module is system-compatible or authorized, and
  switching on the pump and/or the first heat exchanger depending on the presence of the system-compatible or authorized second module.

The first module can be connectable or is connectable to the second module fluidically and/or for signal transmission, for example, via fluid lines or signal lines. Here, the second module can be connectable or connected particularly to a unit to be cooled in order to cool the unit to be cooled. Said second module can particularly be the second module described below. For example, the first module can be referred to as the master module, while the second module can be referred to as the slave module. If a system-incompatible or unauthorized second module is detected, the pump and/or the first heat exchanger can be prevented from being switched on at all. This ensures the use of system-compatible parts and components in a system having a modular design.

The control unit can be designed to determine the identity of the second module on the basis of a specific encryption and/or coding of the signals. It can be provided that only a data block designed for this purpose is encrypted or coded. In this case, only part of the signal is encrypted or coded. The unencrypted part of the signal can comprise, for example, data, sensor signals, control signals and/or regulation signals. Alternatively, it can also be provided that the signal is encrypted as a whole. In this case, for example, all data, sensor signals, control signals and/or regulation signals can be encrypted or coded. The first module and the second module can each have a decryption device/decoding device or encryption device/coding device designed for this purpose. The signal can possibly also be checked for completeness, for example, by means of a check digit or the like.

Alternatively or additionally, the identification feature can comprise a serial number of the second module. In this case, the control unit can determine the identity of the second module based on the serial number of the second module. The identity of the second module can preferably be uniquely determined using the identification feature. The control unit can further be designed to activate the pump and/or the first heat exchanger as a function of the identity of the second module. The signals can also comprise cooling parameters, particularly of the second module and/or a unit to be cooled, wherein the control unit is designed to activate the pump and/or the first heat exchanger as a function of the cooling parameters. The first heat exchanger can have a fan and a radiator, wherein the fan is preferably arranged on the radiator for cooling the radiator. The cooling effect of the first heat exchanger can be increased or controlled or regulated in this way. The pump is fluidically connectable to the radiator and thus pump the cooling fluid through the radiator.

The performance of the pump and the fan can be variably controlled as required by the control unit of the first module. The control unit of the first module can be designed to variably control the fan with constant pump output. Furthermore, the control unit of the first module can be designed to variably control the pump with constant fan output.

The control unit of the first module can have a processor, a microcontroller, a microprocessor and/or a digital signal processor. Furthermore, the first module can have a memory such as random access memory (RAM), read only memory (ROM), a hard disk, a magnetic storage medium and/or an optical drive. An identification code or an identification number can be stored in the memory, for example a UUID (Universally Unique Identifier), which is associated with the first module. The identification code or the identification number can be unique for a plurality of first modules (see below) for each of these first modules, that is, different first modules have different identification codes or identification numbers. A program can be stored in the memory, for example, software for processing or editing the data and/or signals and/or software for controlling the pump and/or the fan.

According to a further aspect, a second module, particularly for a fluid cooling system, is provided. The second module comprises at least one second communication unit. The second communication unit is designed to send an identification feature of the second module to a first communication unit of a first module.

The first module can particularly be the first module described above. The identification feature can be or comprise a serial number, a specific encryption or a specific coding of signals. The second module can be connectable or is connectable to the first module fluidically and/or for signal transmission, for example, via fluid lines or signal lines.

The second module can also have a second heat exchanger, which is connectable or is connected to a unit to be cooled, particularly for heat dissipation. The second module is fixedly or detachably connectable to the unit to be cooled. In some embodiments, the unit to be cooled is part of the second module. The unit to be cooled can comprise or be a CPU and/or a GPU, typically of a PC. The PC can in turn be a desktop, notebook or tablet computer.

The second communication unit can be designed to receive signals and forward them to the first communication unit. The second communication unit thus can be designed to receive cooling parameters of the unit to be cooled and to send said cooling parameters to the first communication unit. The cooling parameters can comprise sensor signals and/or sensor data and/or temperature data and/or energy consumption data and/or pump parameters and/or heat exchanger parameters and/or control signals and/or regulation signals.

The unit to be cooled is typically a control and processing unit, such as a CPU (central processing unit) or a GPU (graphics processing unit). Such a control and processing unit can usually output how high its current clock speed, temperature or power is. The pump or fan of the first module can then be activated based on these cooling parameters. Furthermore, the control and processing unit generally outputs a fan speed which can be used to control the fan.

Furthermore, the second module can have a memory such as random access memory (RAM), read only memory (ROM), a hard disk, a magnetic storage medium and/or an optical drive. An identification code or an identification number, for example, a UUID, which is associated with the second module, can be stored in the memory. The identification code or the identification number can be unique for a plurality of second modules (see below) for each of these second modules, that is, different second modules have different identification codes or identification numbers. After the connection between the first communication unit and the second communication unit has been established, the identification code or the identification number can be transmitted to the first communication unit of the first module.

According to a further aspect, a fluid cooling system is proposed which has the first module described above and the second module described above. In addition, the fluid cooling system comprises cooling lines, signal lines and a coupling device for connecting the first module to the second module. The coupling device is designed to fluidically connect the first heat exchanger and the second heat exchanger to one another by coupling the cooling fluid lines and to connect the first communication unit and the second communication unit to one another by coupling the signal lines.

The coupling device here can particularly be the coupling device of the type described above. The cooling fluid system described in connection with the first and second modules can thus have the features of the cooling fluid system described in connection with the coupling device and vice versa.

The cooling fluid system can be expanded as required thanks to the modularity. The cooling fluid system can thus have a plurality of first modules and/or a plurality of second modules, wherein the fluid lines and the signal lines are connectable or are connected to one another in series. Furthermore, the cooling fluid system can have a plurality of coupling devices by means of which the modules are connectable to one another.

If there are a plurality of second modules, it is advantageous to activate the pump and/or the first heat exchanger of the first module (or the first modules) in accordance with a predetermined protocol. The plurality of second modules can, for example, send cooling parameters to the first communication unit. The control unit of the first module, for example, is designed for evaluating and/or comparing the cooling parameters of the second modules, controlling the pump and/or the first heat exchanger based on the evaluation and/or the comparison.

It can be provided that the pump is activated based on a single cooling parameter. It would be conceivable, for example, for the pump to be activated by a plurality of second modules based on a cooling parameter of a single second module. The corresponding cooling parameter is usually transmitted to the first module by every second module via the corresponding communication units. The control unit of the first module compares the cooling parameters with one another and then decides, based on the comparison, how the pump is to be activated. If, for example, temperature data are transmitted to the first control unit as cooling parameters, the first control unit can activate the pump based on the highest temperature. The same can apply to the control of the first heat exchanger or the fan.

If there are a plurality of first modules, it is advantageous if the first modules coordinate with one another. It should be clarified in advance which control unit will be responsible for controlling the overall system. It can be provided, for example, that each first module has a serial number, wherein the serial number can be assigned according to the date of manufacture of the first module. The first module having the highest serial number can then take over control of the pumps or fans of the overall system. Furthermore, the cooling data of the second module, which has the highest serial number, can also be used to control the pumps or fans. If a plurality of first modules are provided, the controls of the pumps or the fans can be coordinated with one another. If, for example, the sound level (volume) of the overall system is to be reduced, the output of particularly loud pumps (or fans) can be regulated down, while the output of particularly quiet pumps (or fans) can be increased. The control units of the first modules can be designed to activate their pumps such that a fluid throughput of their respective pumps is the same.

In one embodiment, the signal lines are designed as a single-wire bus system. This can simplify the system.

According to a further aspect, a method is provided. The method is particularly suitable for operating a fluid system. The method comprises at least the following steps:

receiving signals, wherein the signals have an identification feature of a second module, identifying the second module on the basis of the identification feature, checking whether the second module is system-compatible or authorized, and switching on the pump and/or a first heat exchanger depending on whether the system-compatible or authorized second module is present.

If no second module can be identified, it is determined that the signals originate from a system-incompatible or unauthorized module. The pump or the first heat exchanger are not switched on in this case.

If the second module is system-compatible or authorized, the pump and/or the second heat exchanger can be activated depending on the identity of the second module.

The method can particularly have one or more features and one or more steps that were described above in the explanation of the modules and/or the cooling fluid system and/or the coupling device. The method can, for example, be implemented as code, for example, in the form of a computer program on a computer-readable medium, such as a volatile memory or a non-volatile memory.

Overall, the modularity of the coupling device or the fluid cooling system results in a number of advantages over one-piece coupling devices or non-expandable fluid cooling systems from the prior art:

- expansion of the fluid cooling system using further modules;
- flexibility in the offer, larger product variety;
- cheaper production through identical series and simpler assembly processes; and/or
- inexpensive repair by replacing the defective component.

Furthermore, the modular structure of the coupling device or the fluid cooling system can reduce the costs and outlay for design, manufacture, storage, distribution, maintenance and repair.

The use of the modular fluid cooling system described above in desktop PCs and other electronic systems can offer several advantages over conventional air cooling systems or encapsulated fluid cooling systems. In this way, the first heat exchanger, which transfers the heat to the ambient air, can be structurally positioned further away from the heat source. The spatial separation of the proposed modular fluid cooling system allows installation space and weight restrictions to be circumvented. This means that radiators having a larger surface can be used and the cooling capacity can be increased.

The following functions can be implemented through the signal transmission of the communication units:

- checking for the correct assembly;
- ensuring the use of system-compatible components and parts;
- transmitting signals for control and regulation functions.

In contrast to a solution having separately laid signal lines, if the couplings are correctly coupled, signal transmission can always be guaranteed and malfunction due to incorrectly connected signal lines can be prevented.

It goes without saying that the embodiments described above can be combined with one another, provided the combinations are not mutually exclusive. Features that were only mentioned in relation to the coupling device described above can also be claimed for the first module, the second module, the fluid cooling system or the method, and vice versa.

DESCRIPTION OF THE FIGURES

In the following, embodiments of the invention are explained in more detail with reference to the accompanying drawings. The figures are schematized and partially simplified. Shown are.

DETAILED DESCRIPTION

Recurring features are provided with the same reference symbols in the figures.

Figure 1:
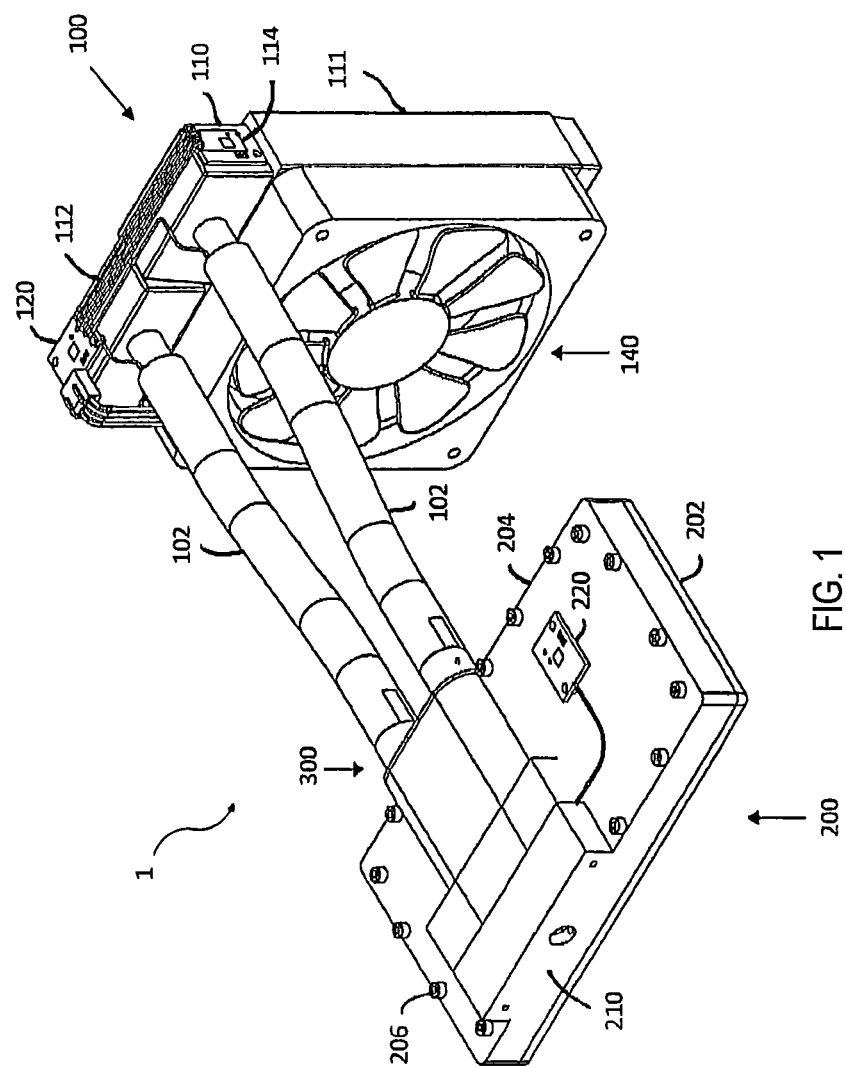
FIG. 1 a view of a modular cooling fluid system having a first module, a second module and a coupling device.
Figure 2:
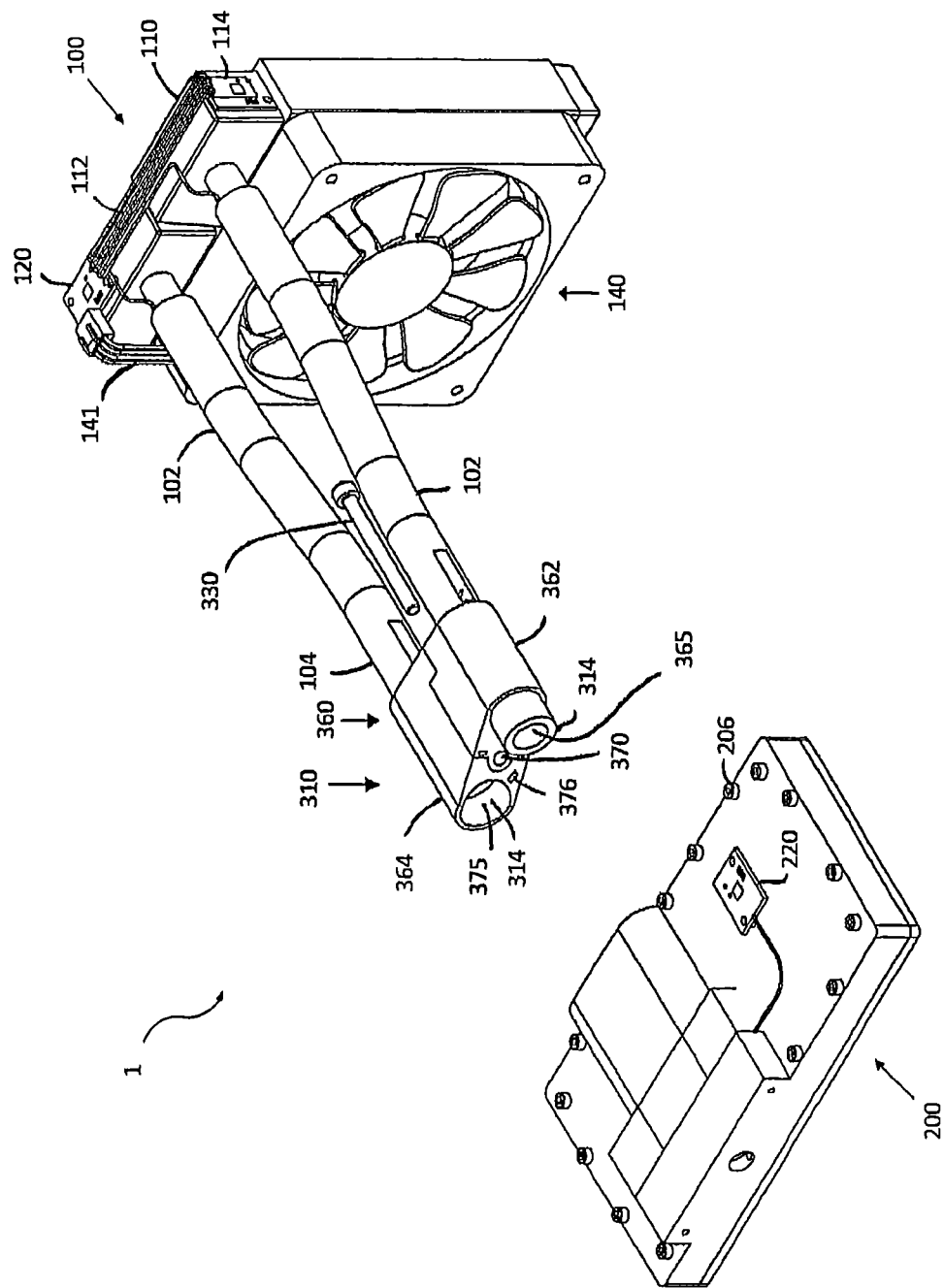
FIG. 2 a view of the cooling fluid system of FIG. 1, wherein the modules are separated from one another.
Figure 3:
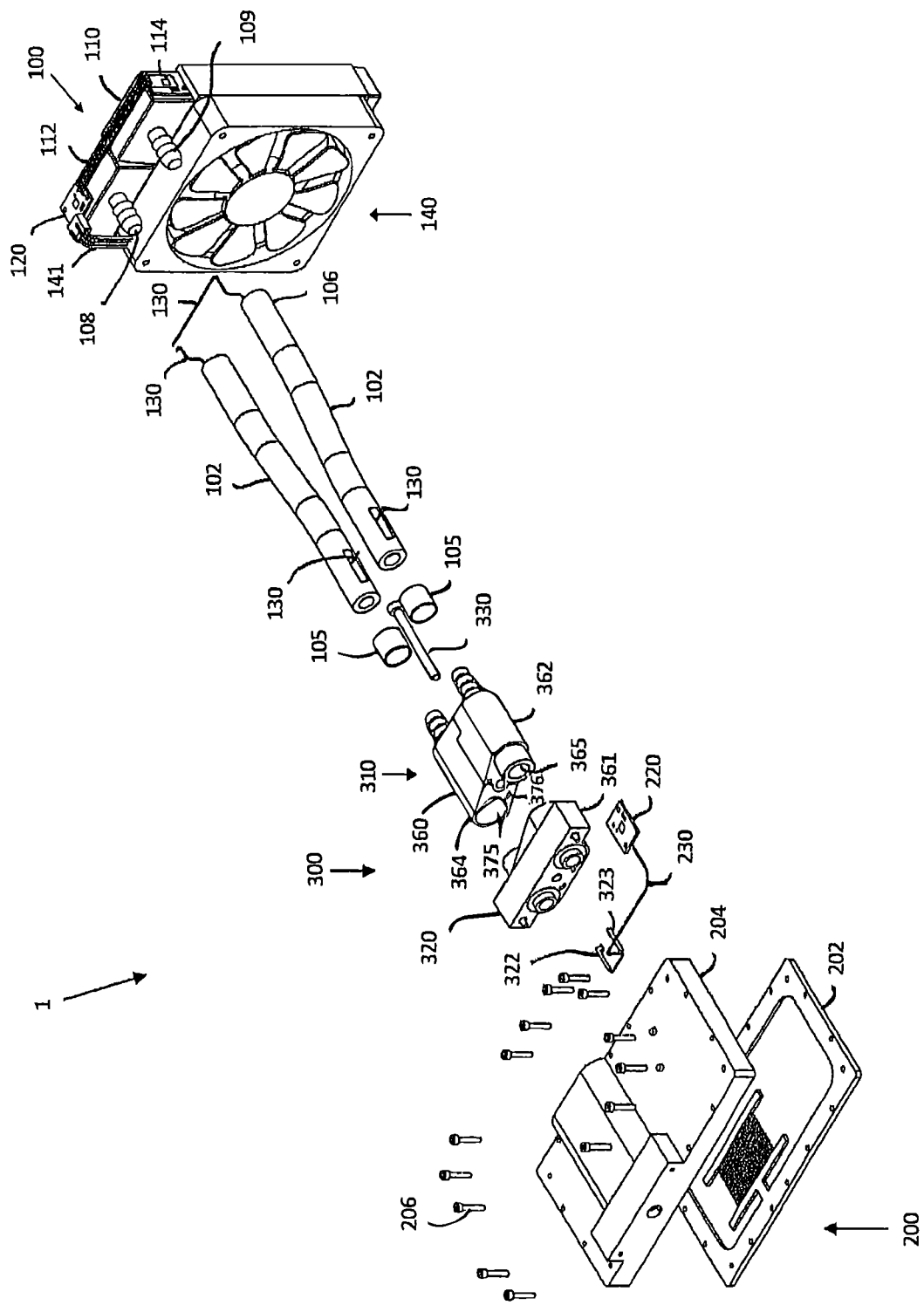
FIG. 3 an exploded drawing of the cooling system of FIG. 1.
Figure 4:
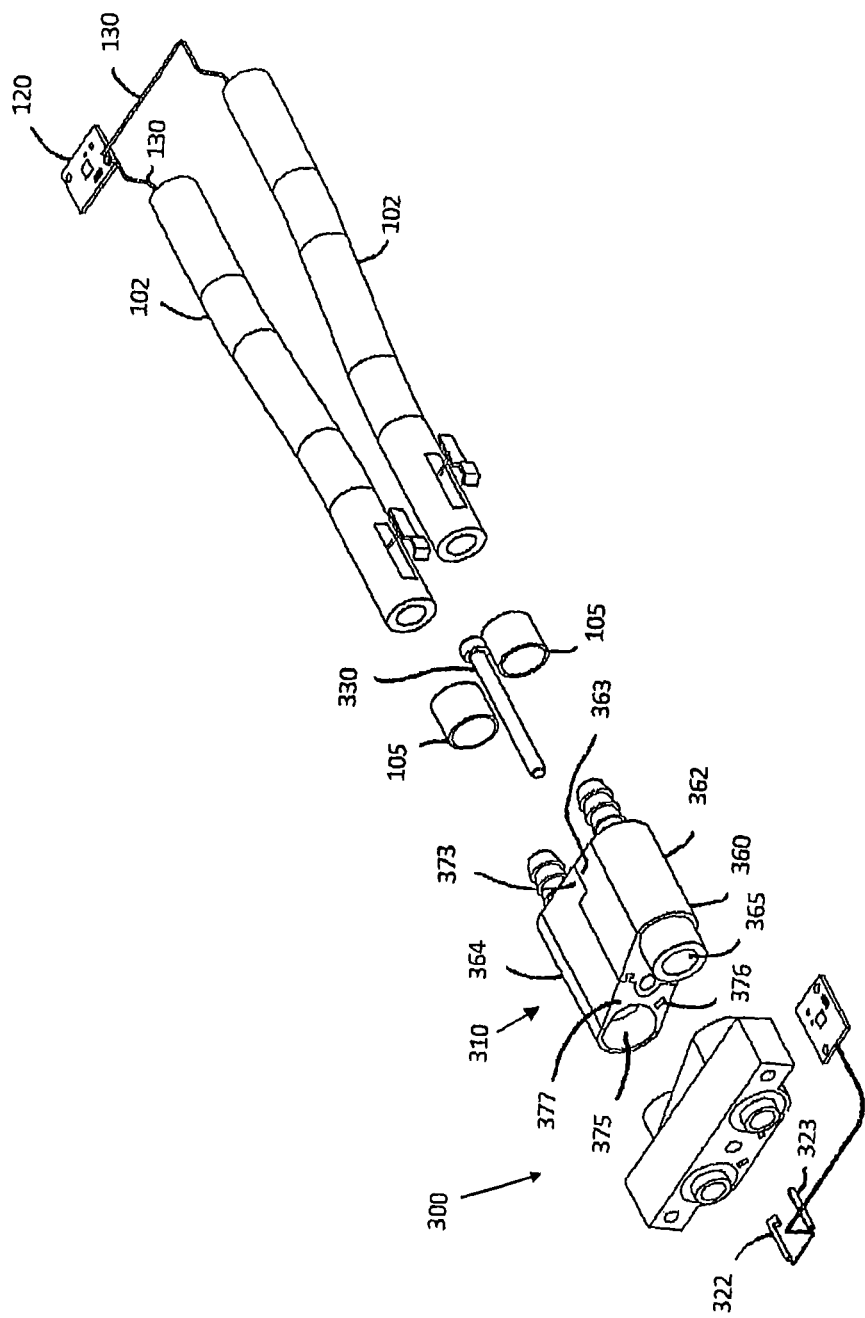
FIG. 4 an exploded drawing of a coupling device.
Figure 5:
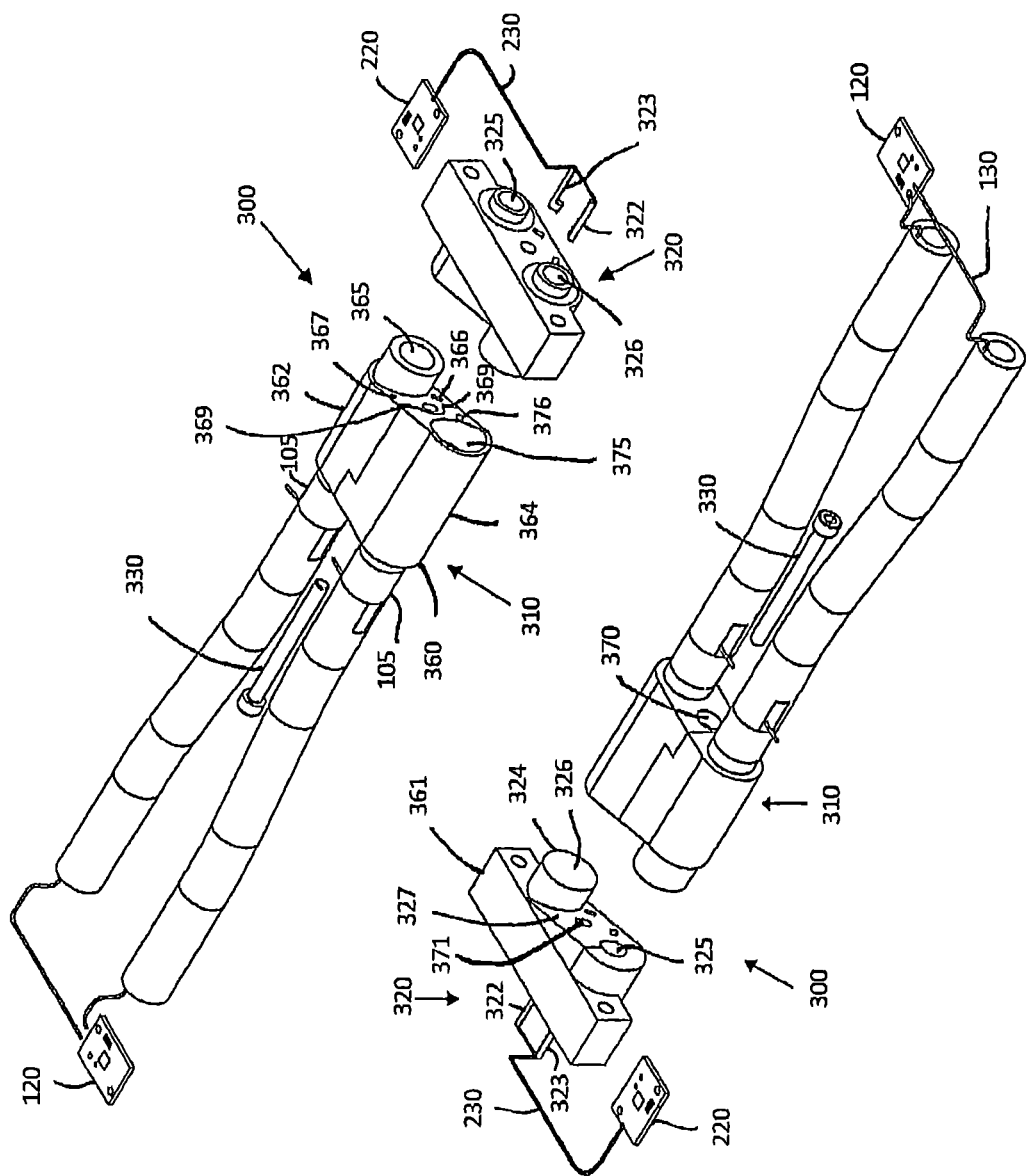
FIG. 5 further views of the coupling device from FIG. 4.
Figure 7:
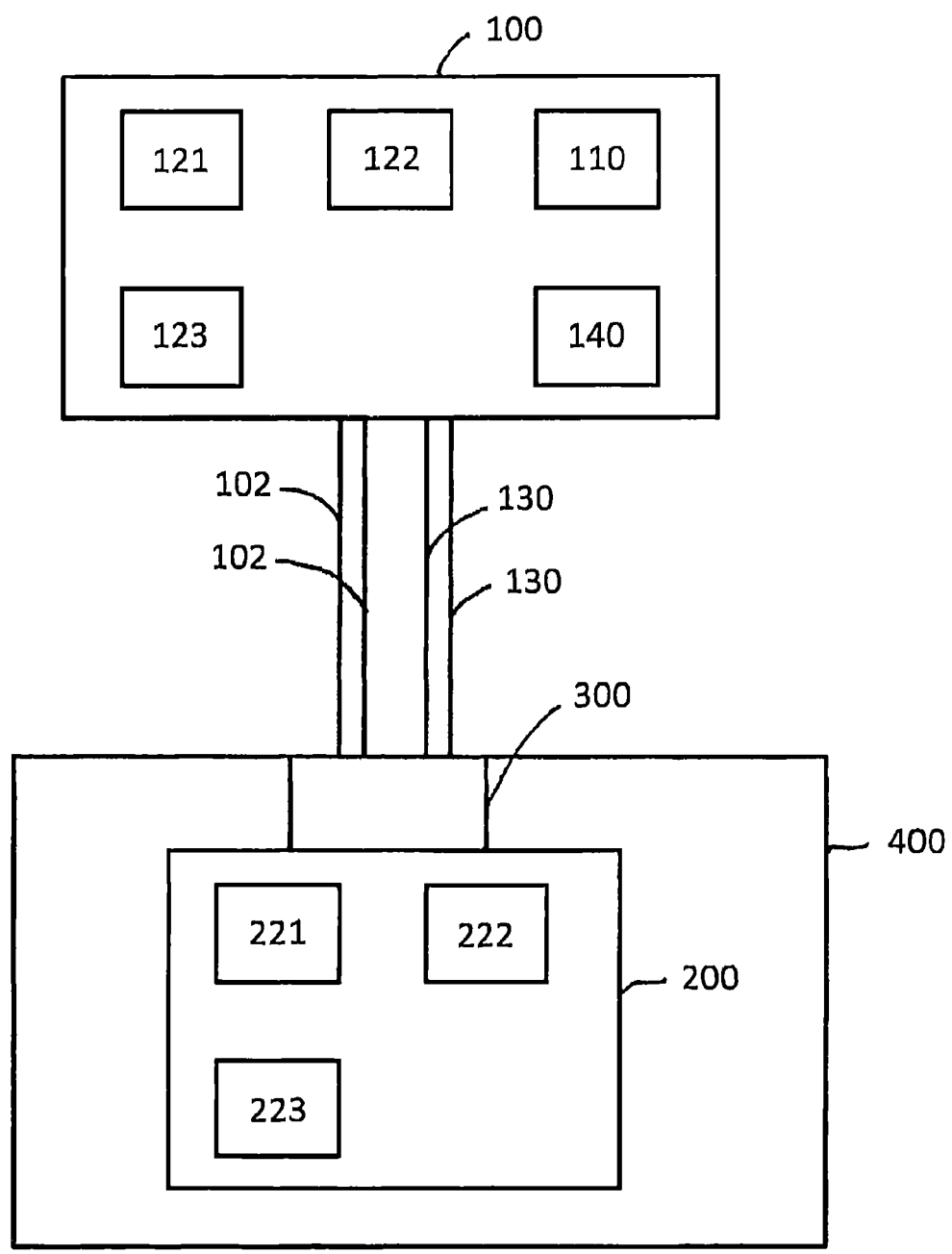
FIG. 7 a schematic representation of a fluid cooling system having a first module, a second module and a coupling device.

FIG. 1 shows a perspective view of a fluid cooling system 1, while FIG. 7 is a schematic representation of the fluid cooling system 1. The fluid cooling system 1 comprises two heat exchangers which are fluidically connected to one another via fluid lines 102, a coupling device 300 and a pump 110. For example, the heat loss from electronic components, such as a graphics card 400, can be transferred to a coolant at the second heat exchanger. The pump 110 conveys the heated cooling liquid through the lines 102 to the first heat exchanger. The first heat exchanger comprises, for example, a radiator 111 through which the heated cooling liquid flows. Here, the heat from the coolant is released into the ambient air via a radiator wall. This heat transfer can be improved by the airflow from a fan 140.

The fluid cooling system 1 comprises two subsystems 100, 200 which are coupled to one another via fluid lines, signal lines and the coupling device 300 (FIG. 1). The subsystems are referred to below as the first module 100 and the second module 200, respectively. The fluid cooling system 1 is created with a closed cooling circuit and a closed signal circuit (signal circuit) by bringing together the first module 100 and the second module 200 via the coupling device 300. The fluid cooling system 1 can be used in different regions. The fluid cooling system 1 can particularly be used to cool computer components, such as a CPU or a GPU. Accordingly, the cooling fluid system 1 can be arranged on a graphics card 400 (see FIG. 7) or on a high-performance electronic circuit board. The cooling fluid of the fluid cooling system 1 is preferably a liquid such as water or distilled water. Other cooling liquids or liquid mixtures can also be used.

First, the coupling device 300 will be discussed in more detail, which can also be clearly seen in FIGS. 2-5. The coupling device 300 comprises a first coupling unit 310 having a first housing 360, which has a first sub-housing 362 and a second sub-housing 364 connectable to the first sub-housing 362. The two sub-housings 362, 364 are respectively manufactured in one piece and can particularly be made of thermoplastic materials. Alternatively, one of the sub-housings 362, 364 or both sub-housings 362, 364 can also be made up of several parts.

The first sub-housing 362 has a first passage opening 365 extending in the axial direction, a first signal interface 366 and a first end face 367. In a similar way, the second sub-housing 364 comprises a second passage opening 375 extending in the axial direction, a second signal interface 376 and a second end face 377.

In FIGS. 1-5, the two sub-housings 362, 364 are arranged parallel to one another and connected to one another laterally. The two sub-housings 362, 364 have side surfaces 368, 378 (indicated in FIG. 6) which rest against one another in the coupled state of the first housing 360. The side surfaces 368, 378 are preferably shaped in a complementary manner, so that the two sub-housings 362, 364 are laterally connectable to one another. For example, the second sub-housing 364 has a projection 373 which engages in a recess 363 of the first sub-housing 362. The projection 373 acts as an axial stop and can prevent a displacement of the first sub-housing 362 in relation to the second sub-housing 364 in the direction of the first module 100. In addition, the two sub-housings 362, 364 can have interlocking profiles 369, such as T-profiles, which extend in the axial direction and enable the two sub-housings 362, 364 to be laterally fixed relative to one another. The two sub-housings 362, 364 are therefore connected to one another in a form-fitting manner.

Furthermore, two spring-driven quick-release locking units 314, which prevent the penetration of gases and the leakage of liquids, are provided at the passage openings 365, 375. The quick-release locking units 314 can have safety valves, for example. Two identical fluid lines 102, such as hoses, can be plugged into the first coupling unit 310. The respective hose end 104 on the coupling side can each be provided with a radial seal in order to prevent the leakage and escape of gases and liquids. The structure of the fluid line 102 can be designed such that at least one signal line 130, such as an electrical cable, can be wound around the fluid line 102 or guided along the fluid line 102. Each fluid line 102 here can be provided with a signal line 130. The fluid line 102 can be designed as a flexible, elastic line and, for example, be essentially made of a plastic such as an elastomer or thermoplastic materials. The fluid line 102 can also comprise a rigid tube made from a hard plastic. A sheathing, such as a fabric hose, which envelops the fluid line 102 at least in some regions, can be provided. For example, the sheathing may be provided at one or both ends of the fluid line 102. The sheathing can also extend from one end to the opposite end of the fluid line 102 and completely cover the fluid line 102, so that the fluid line 102 is not visible. Instead of the fluid line 102, the sheathing can also contain the signal lines 130. The sheathing can stabilize the fluid line 102 and/or also function as a decorative element.

In the embodiment shown, the signal interfaces 366, 376 are designed as electrically conductive, for example, metallic, contact elements. Accordingly, the signal lines 130 are designed as electrically conductive cables. An electrically conductive, for example, a metallic, pick-up ring 105, is compression-molded around the hose end 104 on the coupling device side. Due to the shape, the metallic pick-up ring 105 has electrical contact with the electrical cable 130 and the respective metallic contact element 366, 376. The signal lines 130 can be rotated with respect to the signal interfaces 366, 376 without torsional stress using the pick-up ring 105. The reshaped metallic pick-up ring also has the function of fixing the fabric hose of the fluid line 102. Alternatively, optical contact elements can also be provided for the transmission of optical signals. In this case, the signal lines 130 and signal interfaces 366, 376 are designed as glass fiber cables or optically conductive elements.

Figure 6:
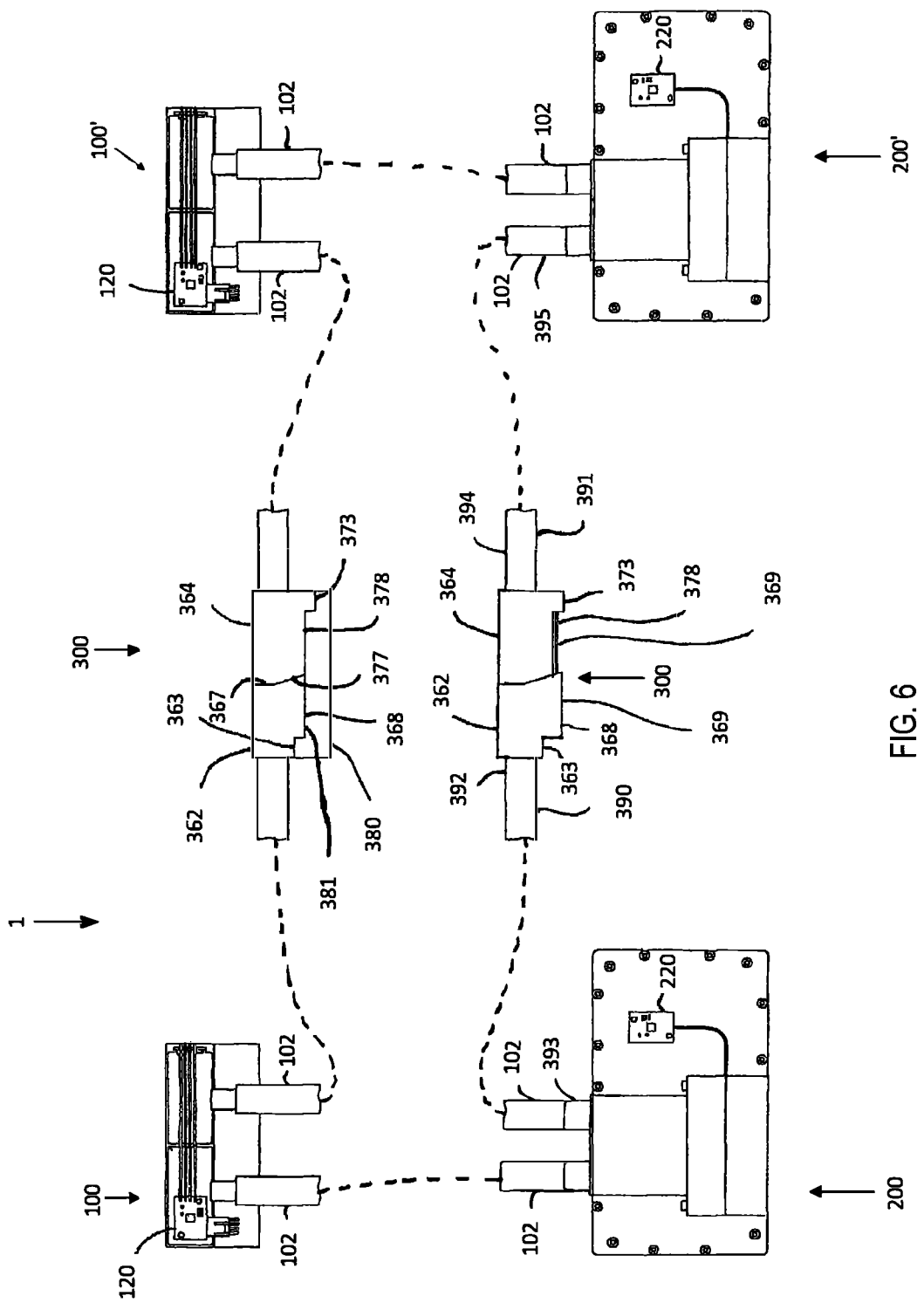
FIG. 6 a modular cooling fluid system having a plurality of first modules, second modules and coupling devices.

The coupling device 300 is shown in an axially coupled state in FIG. 6. It can be seen that the first end face 367 and the second end face 368 are shaped complementary to one another, whereby an axial coupling of the first sub-housing 362 with the second sub-housing 364 is made possible. The two sub-housings 362, 364 are therefore arranged axially one after the other in FIG. 6. In the axially coupled state, the passage openings 365, 375 are fluidically connected to one another and the signal interfaces 366, 376 are also connected to one another. In addition, FIG. 6 shows an axial fixing element 380 which is designed for fixing the first sub-housing 362 and the second sub-housing 364 in the axially coupled state of the two sub-housings 363, 364. For this purpose, the axial fixing element has, particularly, a side surface 381 which is shaped complementary to the first side surface 368 and to the second side surface 378. The side surface 381 of the axial fixing element 380 rests against the side surfaces 368, 378. Accordingly, the axial fixing element also has a projection, a recess and a profile, which interact with the corresponding elements 363, 367, 373 of the sub-housings 362, 364.

The coupling device 300 also comprises a second coupling unit 320 that is connectable to the first coupling unit 310. The second coupling unit 320 is connectable to the first coupling unit 310 in the axial direction, provided that the first coupling unit 310 is in its laterally connected state. For this purpose, the second coupling unit 320 can have a second housing 361 having a third end face 327 which is shaped complementary to the first end face 367 and to the second end face 377. The second housing 361 is integrally molded and can be made of a thermoplastic material. A third passage opening 325 and a fourth passage opening 326 are provided in the housing 361, and these passage openings are each fluidically connectable to the first passage opening 365 and the second passage opening 375. In the second coupling unit 320, there are preferably two spring-driven quick-release locking units 324, which prevent gases from entering or escaping and liquids from running out. The quick-release locking units 324 can have safety valves, for example. In addition, signal interfaces 322, 323 are provided, which are connectable to the signal interfaces 366, 376 of the first coupling unit 310 for signal transmission.

Both a fluid connection (via the corresponding passage openings 325, 326, 365, 375) and a signal connection (via the corresponding signal interfaces 322, 323, 366, 367) are thus established in the coupled state of the two coupling units 310, 320.

Optionally, a passage opening 370 extending in the axial direction can be provided in the first sub-housing 362, into which passage opening 370 a screw 330 can be inserted. The passage opening 370 can additionally or alternatively also be provided in the second sub-housing 364. In the connected state of the coupling units 310, 320, the passage opening 370 is aligned with a further opening 371 which has an internal thread. Alternatively, a long nut can also be arranged in the opening 371. When connecting the two coupling units 310, 320, the screw 330 is inserted through the openings 370, 371 and screwed to the thread of the opening 371 or the long nut.

The end faces 327, 367, 377 are beveled with respect to the axial direction. Incorrect assembly of the coupling units 310, 320 can be prevented by the beveled design of the end faces 327, 367, 377. This can ensure that the fluid lines and the signal lines are correctly connected to one another (avoidance of short circuits).

The first module 100 and the second module 200 are coupled by joining the first coupling unit 310 and the second coupling unit 320. The second coupling unit 320 is generally fixedly connected to the second module 200 before coupling to the first coupling unit 310. For the assembly of the coupling units 310, 320, for example, the screw 330 is used to limit the effect of the assembly force during the coupling process (contrary to the spring-driven quick-release locking units of the coupling units 310, 320) in the region of the coupling system. This force decoupling prevents the assembly force from being introduced either into the graphics card 400 (see FIG. 7) or into a mainboard (application example: personal computer). The first coupling unit 310 and the second coupling unit 320 are thus fixed relative to one another by means of the screw 330.

The details of the modules 100, 200 are discussed in greater detail below, with additional reference being made to FIG. 7. Two modules 100, 200, a coupling device 300 and a graphics card 400 are indicated schematically in FIG. 7.

The first module 100 comprises a control unit 121, a first communication unit 122 and a memory 123, which are arranged, for example, together on a first electronic circuit board 120. The first module 100 furthermore has a pump 110 for conveying the cooling fluid and a first heat exchanger having a radiator 111. The radiator 111 is provided with a fan 140 (see also FIG. 1) to improve the heat dissipation. Two connection nipples 108, 109 are provided, via which the fluid lines 102 are connectable to the pump 110 and the heat exchanger connected thereto. The electrical cables 130 routed with the fluid lines 102 are connected to the first control unit 121. The first control unit 121 monitors and controls a fan 140 via an electrical cable assembly 141. An electrical cable assembly 112 goes from the first control unit 121 to an electrical circuit board 114 of the pump 110. The first control unit 121 monitors and thus also controls the pump 110. An identification code or an identification number, for example a UUID, which is associated with the first module 100, can be stored in the memory 123. The identification code or the identification number can be unique for a plurality of first modules 100, 100' (see below) for each of these first modules 100, 100', that is, different first modules 100, 100' have different identification codes or identification numbers. A program can be stored in the memory 123, for example, software for processing or editing the data and/or signals and/or software for controlling the pump 110 and/or the fan 140.

The second module 200 has a heat exchanger which has a heat sink 210 having a heat sink lower shell 202 and a heat sink upper shell 204. A seal or an adhesive compound can be located between the lower heat sink shell 202 and the upper heat sink shell 204. The lower heat sink shell 202 and the upper heat sink shell 204 together with the seal or adhesive compound can be pressed together, for example, by screws 206 or clip connections. The heat sink upper shell 204 comprises, for example, a fluid inlet and a fluid outlet, which are fluidically connected to the passage openings 325, 326 of the second coupling unit 320. The second coupling unit 320 is thus located at the fluid inlets/outlets on the heat sink upper shell 204, wherein it is possible to ensure the tightness between the two aforementioned components by means of two axial seals. For example, a long nut for fastening the second coupling unit 320 to the heat sink upper shell 204 is located in the second coupling unit 320. The second coupling unit 320 can be fastened both to the fluid inlets/outlets and to the heat sink upper shell 204 by screws, for example.

The second module 200 can be mounted on a unit to be cooled. In the embodiment shown, the second module 200 is designed to be arranged on or at a processor, such as a GPU or a CPU, that is to be cooled. If a GPU is to be cooled, the installation of the second module 200 takes place preferably via the GPU and parallel to the graphics card 400. The lower heat sink shell 202 is arranged above the GPU in the embodiment shown. The overall height of the GPU is typically less than the overall height of other components. Sufficient space is therefore available here for the second module 200 and the coupling device 300. Overall, the design and the positioning of the coupling device 300 above the GPU of the graphics card 400 and the design of the heat sink 210 ensure that the overall dimensions, namely graphics card plus heat sink 210 plus coupling device 300, do not exceed the installation space restrictions of two PCIe slots (Peripheral Component Interconnect Express slots). Overall, a practical, user-friendly, stable and visually appealing system can be created.

As mentioned above, two signal interfaces 322, 323, which can be designed as metallic contact elements, for example, are located in the second coupling unit 320. The signal interfaces 322, 323, such as electrical cables, are connected to signal lines 230. The signal lines 230 are routed out of the second coupling unit 320 and connected to the second electronic circuit board 220. The second electronic circuit board 220 is located on the outer side of the heat sink upper shell 204 and can likewise be cooled thereby if necessary. A second control unit 221, a second communication unit 222 and a memory 223 are arranged on the second electronic circuit board 220.

The following describes how the first module 100 and the second module 200 can communicate with one another.

The first communication unit 122 of the first module 100 is designed for receiving signals from the second module 200. Furthermore, the second communication unit 222 of the second module 200 is designed to send signals to the first module 100. The communication units 122, 222 are intended to ensure that only system-compatible modules/components are to be assembled. First of all, the communication units 122, 222 can only communicate with one another when the signal circuit is established via the signal interfaces 322, 323, 366, 376 and the signal lines 130, 230. If the modules 100, 200 are de-coupled, no communication between the communication units 122, 222 is possible, which can be determined by the communication units 122, 222 or the control units 121, 221. Thus, at least one of the communication units 122, 222 and/or at least one of the control units 121, 221 can be designed to recognize whether the coupling device 300 is in a coupled or decoupled state based on the presence of the connection between the two communication units.

In the coupled state of the modules 100, 200 and thus the coupling device, the two heat exchangers of the modules 100, 200 are fluidically connected to one another via the fluid lines. The control unit 222 is preferably designed to switch on or activate the pump 110 only when the coupling device 300 is in the coupled state.

Alternatively or additionally, it can be provided as a safety precaution that the communication units 122, 222 communicate with one another in accordance with a communication protocol described in more detail below.

After closing the signal circuit, the second communication unit 222 of the second module 200 can be designed to send an identification feature of the second module 200 to the first communication unit 122 of the first module 100. The identification feature can comprise, for example, a serial number, a specific encryption of signals and/or a specific coding of signals. The serial number is usually stored in the memory 223. The first communication unit 122 is designed for receiving signals from the second module 200, and particularly for receiving the identification feature of the second module 200. The control unit 121 of the first module 100 can determine the identity of the second module 200 on the basis of the identification feature. For example, the control unit 121 compares the serial number of the second module 200 with a list of stored serial numbers in the memory 123. If the serial number of the second module 200 is present in the list and is classified as system-compatible, the control unit 121 can determine that the second module is system-compatible or authorized. However, if the serial number of the second module is not on the list or is classified as not system-compatible, the control unit 121 determines that the second module is not system-compatible or is not authorized.

In addition, the control unit 121 can be designed to determine the identity of the second module 200 on the basis of a specific encryption and/or coding of the signals. It can be provided that only a data block designed for this purpose is encrypted or coded. In this case, only part of the signal is encrypted or coded. The unencrypted part of the signal can comprise, for example, coding signals, sensor signals, control signals and/or regulation signals. Alternatively, it can also be provided that the entire signal is encrypted. In this case, the coding signals, sensor signals, control signals and/or regulation signals can be encrypted. The first module 100 and the second module 200 can each have a decryption device/decoding device or encryption device/coding device designed for this purpose.

The control unit 121 then only switches on the pump 110 and/or the fan 140 if the second module 200 is system-compatible or authorized. This can avoid, for example, that the pump 110 or the fan 140 are activated in the case of incorrectly connected or counterfeit modules. The control unit 121 can further be designed to control the pump 110 and/or fan 140 as a function of the identity of the second module 200. In this way, for example, the output of the pump 110 or the fan 140 can be adapted to the second module 200 as required.

The second communication unit 222 can further be configured to receive signals, for example, from the first communication unit 122, from another second communication unit 222 (if a plurality of second modules are provided, see below) or from a control and processing unit such as a CPU or GPU. If the unit to be cooled is a CPU or a GPU, the CPU or GPU can usually output how high its current clock speed, temperature or performance is. Conventional CPUs or GPUs further provide a fan speed which can be used to control a fan provided for air cooling of the CPU or GPU. These cooling parameters can be transmitted to the second communication unit via further signal lines (not shown). The second communication unit 222 receives the cooling parameters and forwards them to the first communication unit 122 in digital form. After the cooling parameters have been interpreted by the first control unit 121, the first control unit 121 will activate the pump 110 and/or the fan 140 as a function of these cooling parameters. The cooling parameters generally comprise sensor data, temperature data, energy consumption data, pump parameters, heat exchanger parameters, control signals and/or regulation signals.

FIG. 6 shows a fluid system 1 which has a plurality of first modules 100, 100' and a plurality of second modules 200, 200'. In the embodiment shown, two first modules 100, 100' and two second modules 200, 200' are respectively provided, wherein the number of first modules 100, 100' and the number of second modules 200, 200' can also be larger or smaller. The first modules 100, 100' and the second modules 200, 200' form a closed fluid circuit and a closed signal circuit. For this purpose, the fluid lines 102 of the modules 100, 100', 200, 200' and the signal lines of the modules 100, 100', 200, 200' are connected to one another in series, which is indicated in FIG. 6 by dashed lines. The signal lines are designed here as a single-wire bus system. The first modules 100, 100' can be referred to as master modules, while the second modules 200, 200' can be referred to as slave modules.

If a plurality of modules 100, 100', 200, 200' is to be connected to one another, at least one extension line 390, 391 can be provided. In FIG. 6, two extension lines 390, 391 are shown, which connect the modules 200, 200' to one another and thereby enable the fluid connection and the signal transmission of the modules 200, 200'. The extension lines 390, 391 are further connected to one another. The above-described first sub-housing 362 can be fastened to a first end 392 of the extension line 390, while the above-described second sub-housing 364 can be fastened to a second end 393 of the extension line 390 opposite the first end. Accordingly, a second end 394 of the extension line 391 is provided with the sub-housing 364 and is connected to the first end 392 of the extension line 390. The first sub-housing 362 is arranged at a first end 395 of the extension line 391. The extension lines 390, 391 each comprise a fluid line and a signal line which connect the passage openings or signal interfaces of the sub-housings 362, 364 of the extension lines 390, 391 to one another. In the embodiment in FIG. 6, the axial fixing element 380 for connecting the extension lines 390, 391 has been dispensed with for the sake of clarity. Of course, the extension lines 390, 391 can preferably also be coupled to one another using an axial fixing element 380.

Before the pumps 110 of the first modules 100, 100' start pumping, it should be checked, among other things, whether there is a closed fluid circuit, what power the pumps 110 of the modules 100, 100' should work with, whether system-compatible modules are present and which modules 100, 100', 200, 200' are connected to one another. For this purpose, the second communication units 222 of the second modules 200, 200' send their identification features to the first communication units 122 of the first modules 100, 100'. Signals originating from other modules can be forwarded. If, for example, the second module 200' shown in FIG. 6 receives a signal sequence from the second module 200, the communication unit 222 is designed to forward the signals to the first communication unit 122 of the first module 100'. In a similar manner, the communication unit 122 of the module 100' can forward the signals of the second module 200' to the first module 100.

The first modules 100, 100' coordinate with each other regarding which module 100 or 100' takes over the entire system control. This can be done, for example, based on the serial numbers of the first modules 100, 100'. It can be provided, for example, that the first module 100 having the highest serial number or alternatively the lowest serial number takes over the system control and thus also activates the other first module 100' or its pump 110 and its fan 140. This module 100, or the control unit 121 of this module 100, can then be designed for evaluating and/or comparing the cooling parameters of all second modules 200, 200' and for controlling the pumps 110 and the fans 140 based on the evaluation and/or the comparison. If the GPU cooled by the second module 200 indicates a temperature of 40° C. while the GPU cooled by the second module 200' has a temperature of 50° C., the pumps 110 of the modules 100, 100' can be activated based on the highest measured temperature value. Furthermore, the pumps 110 of the modules 100, 100' can also be controlled based on the highest serial number of the second modules 200, 200'.

It goes without saying that the embodiments shown in the figures and described above can be combined with one another, provided that the combinations are not mutually exclusive. Features that were only mentioned in relation to the coupling device 300 described above can also be claimed for the first module 100, 100', the second module 200, 200' or the fluid cooling system 1 described above, and vice versa.

LIST OF REFERENCE SIGNS 1 fluid cooling system
100 first module
100' first module
102 fluid lines
104 coupling-side end
105 electrically conductive ring
106 radiator-side end
108 connection nipple
109 connection nipple
110 pump
111 radiator
112 cable assembly 114 electronic circuit board
120 first electronic circuit board
121 first control unit
122 first communication unit
123 memory
130 signal line
140 fan
141 cable assembly
200 second module
200' second module
202 heat sink lower shell
204 heat sink upper shell
206 screws
210 heat sink
220 second electronic circuit board
221 second control unit
222 second communication unit
223 second memory
230 signal line
300 coupling device
310 first coupling unit
314 quick-release locking unit
320 second coupling unit
322 signal interface
323 signal interface
324 quick-release locking unit
325 third passage opening
326 fourth passage opening
327 end face
330 screw
360 first housing
361 second housing
362 first sub-housing
363 recess
364 second sub-housing
365 first passage opening
366 first signal interface
367 first end face
368 first side surface
369 profile
370 screw opening
371 opening
373 projection
375 second passage opening
376 second signal interface
377 second end face
378 second side surface
380 axial fixing element
381 side surface
390 extension line
391 extension line
392 first end of extension line 390
393 second end of extension line 390
394 first end of extension line 391
395 second end of extension line 391
400 electronic components

The invention claimed is:

1. A first module for a fluid cooling system of a PC, comprising a control unit, a first communication unit, a pump for a cooling fluid, and a first heat exchanger, wherein the first communication unit is configured to receive signals from at least one second module, the signals having an identification feature of the second module, wherein the control unit, on the basis of the identification feature, is designed for identifying the second module, checking whether the second module is system-compatible or authorized, and switching on the pump and/or the first heat exchanger depending on the presence of the system-compatible or authorized second module, wherein the second module is connectable or connected to a GPU and/or a CPU to be cooled of the PC.

2. The first module according to claim 1, wherein the identification feature comprises a serial number of the second module.

3. The first module according to claim 1, wherein the control unit is designed to determine the identity of the second module on the basis of a specific encryption and/or coding of the signals.

4. The first module according to claim 1, wherein the control unit is designed to control the pump and/or the first heat exchanger as a function of the identity of the second module.

5. The first module according to claim 1, wherein the signals comprise cooling parameters, and the control unit is designed to control the pump and/or the first heat exchanger as a function of the cooling parameters.

6. The first module according to claim 5, wherein the cooling parameters comprise sensor data and/or temperature data and/or energy consumption data and/or pump parameters and/or heat exchanger parameters and/or control signals and/or regulation signals.

7. The first module according to claim 1, wherein the first module is adapted for use with the second module, wherein the second module comprises a second heat exchanger, which is connectable to a unit to be cooled, and a second communication unit, the second communication unit being designed: for sending an identification feature of the second module to the first communication unit of the first module, wherein cooling fluid lines, signal lines and a coupling device connect the first module to the second module, the coupling device being designed to fluidically connect the first heat exchanger and the second heat exchanger to one another by coupling the cooling fluid lines and to connect the first communication unit and the second communication unit to one another by coupling the signal lines.

8. The first module according to claim 7, wherein the identification feature comprises a serial number, a specific encryption or a specific coding of signals.

9. The first module according to claim 7, wherein the second communication unit is designed to receive signals and forward them to the first communication unit.

10. The first module according to claim 7, wherein the second communication unit is designed to receive cooling parameters of the unit to be cooled and to send said cooling parameters to the first communication unit.

11. The first module according to claim 10, wherein the cooling parameters comprise sensor data and/or temperature data and/or energy consumption data and/or pump parameters and/or heat exchanger parameters and/or control signals and/or regulation signals.

12. The first module according to claim 7, comprising a plurality of first modules and/or a plurality of second modules, wherein the fluid lines and the signal lines of the modules are connectable or are connected to one another in series.

13. The first module according to claim 12, wherein the control units of the first modules are designed to activate the pumps or heat exchangers according to a predetermined protocol, wherein the protocol is based on serial numbers of the first modules and/or the second modules.

14. The first module according to claim 12, wherein the plurality of second modules send cooling parameters to the first communication unit, and the control unit of the first module is designed for evaluating and/or comparing the cooling parameters of the second modules, controlling the pump and/or the first heat exchanger based on the evaluation and/or the comparison.

15. The first module according to claim 7, wherein the signal lines are designed as a single-wire bus system.

16. A first module for a fluid cooling system of a PC, comprising: a control unit, a first communication unit, a pump for a cooling fluid, and a first heat exchanger, wherein the first communication unit is configured to receive signals from at least one second module, the signals having an identification feature of the second module, wherein the control unit, on the basis of the identification feature, is designed for identifying the second module, checking whether the second module is system-compatible or authorized, and switching on the pump and/or the first heat exchanger depending on the presence of the system-compatible or authorized second module, wherein the second module is connectable or connected to a GPU and/or a CPU to be cooled of the PC, wherein the first module is adapted for use with the second module, wherein the second module comprises a second heat exchanger, which is connectable to a unit to be cooled, and a second communication unit, the second communication unit being designed: for sending an identification feature of the second module to the first communication unit of the first module, wherein cooling fluid lines, signal lines and a coupling device connect the first module to the second module, the coupling device being designed to fluidically connect the first heat exchanger and the second heat exchanger to one another by coupling the cooling fluid lines and to connect the first communication unit and the second communication unit to one another by coupling the signal lines.

* * * * *